United States Patent
Yang et al.

(10) Patent No.: US 7,648,852 B2
(45) Date of Patent: Jan. 19, 2010

(54) LOW-VOLTAGE ORGANIC THIN FILM TRANSISTOR AND FABRICATION METHOD THEREOF

(75) Inventors: Jae Woo Yang, Daejun (KR); Chung Kun Song, Busan (KR); Kang Dae Kim, Busan (KR); Gi Seong Ryu, Busan (KR); Yong Xian Xu, Busan (KR); Myung Won Lee, Busan (KR)

(73) Assignee: Dong-A University Research Foundation For Industry-Academy Cooperation, Busan (KR)

( * ) Notice: Subject to any disclaimer, the term of this patent is extended or adjusted under 35 U.S.C. 154(b) by 0 days.

(21) Appl. No.: 11/696,805

(22) Filed: Apr. 5, 2007

(65) Prior Publication Data
US 2008/0185677 A1 Aug. 7, 2008

(30) Foreign Application Priority Data
Feb. 6, 2007 (KR) .................. 10-2007-0012370

(51) Int. Cl.
*H01L 21/00* (2006.01)
*H01L 51/40* (2006.01)
(52) U.S. Cl. .................................. 438/82; 438/99
(58) Field of Classification Search .............. 438/82, 438/99; 257/E21.259, E21.26
See application file for complete search history.

(56) References Cited

U.S. PATENT DOCUMENTS 6,207,472 B1    3/2001   Callegari et al.
6,433,359 B1    8/2002   Kelley et al.
7,071,123 B2 *  7/2006   Shim et al. .................. 438/780
2005/0059193 A1 3/2005   Yoneya
2007/0181871 A1* 8/2007  Song et al. .................... 257/40

FOREIGN PATENT DOCUMENTS

JP   2003-258261    9/2003
JP   2003-258260    10/2003
KR   1020050031858  4/2005

OTHER PUBLICATIONS

M. Halik et al "Low-voltage organic transistors with an amorphous molecular gate dielectric", Letters to Nature, vol. 431, Oct. 21, 2004, NATURE.

* cited by examiner

*Primary Examiner*—Hung Vu
(74) *Attorney, Agent, or Firm*—Lowe Hauptman Ham & Berner, LLP (57) ABSTRACT

The present invention provides an organic thin film transistor (OTFT) being operatable at a low-voltage. The OTFT has a gate dielectric layer of ultra-thin metal oxide or a dual gate dielectric layer of metal oxide and organic dielectric. The metal oxide layer is self-grown to a thickness lower than 10 nm by direct oxidation of a metal gate electrode in $O_2$ plasma process at a temperature lower than 100° C. The gate electrode is deposited with pattern on a plastic or glass substrate. An organic semiconductor layer is deposited on the gate dielectric layer, and source/drain electrodes are formed thereon. In case the dual gate dielectric layer is used, the source/drain electrodes can be disposed under the organic semiconductor layer to realize a bottom contact structure.

4 Claims, 8 Drawing Sheets

LOW-VOLTAGE ORGANIC THIN FILM TRANSISTOR AND FABRICATION METHOD THEREOF

CROSS REFERENCE

Applicant claims foreign priority under Paris Convention and 35 U.S.C. § 119 to the Korean Patent Application No. 10-2007-0012370, filed Feb. 6, 2007 with the Korean Intellectual Property Office.

BACKGROUND OF THE INVENTION

1. Field of the Invention

The present invention relates generally to organic thin film transistor (OTFT) technology and, more particularly, to a low-voltage OTFT having a gate dielectric layer of ultra-thin metal oxide self-grown by direct oxidation of a metal gate electrode in $O_2$ plasma process or having a dual gate dielectric layer composed of a self-grown metal oxide layer and an organic dielectric layer.

2. Description of the Related Art

In these days organic semiconductor such as pentacene has been widely studied. Organic semiconductor is produced by various synthesis ways and easily formed in the shape of fiber or film. Additionally, organic semiconductor has good flexibility, good conductivity, and relatively low cost of production. Thanks to these advantages, organic semiconductor is studied as a new material available for wide areas including electronic devices and optical devices.

The OTFT employs organic semiconductor for semiconductor regions in comparison with typical silicon TFT using amorphous silicon. Though being similar in structure to the typical silicon TFT, the OTFT has merits in fabrication such as simpler processes and lower cost. For such reasons, new attempts to apply OTFT technology to advanced electronic applications, including flexible display, radio frequency identification (RFID), and a great variety of portable devices, continue today.

However, modern OTFT technology may have some technical problems to be solved. One of them is to develop a new process of forming a gate dielectric layer at a lower temperature. Silicon oxide or silicon nitride conventionally used as the gate dielectric layer may be formed at higher temperature, thus being not applicable to a glass or plastic substrate.

Another problem with the existing OTFT is to reduce an operating voltage. Low power consumption is prerequisite to applications such as flexible display and RFID, however the OTFT often exceeds 20V. This is due to a relatively thick gate dielectric layer, which commonly reaches 100 nm or more.

Various approaches to solve these problems have been introduced in the art. For example, U.S. Pat. No. 6,207,472 discloses that a gate dielectric layer is formed of $Ta_2O_3$, $V_2O_3$, $TiO_2$, etc. at 25~150° C. by using sputtering, spinning, etc. In another case, Korean Published Application No. 2005-31858 discloses an $Al_2O_3$ gate dielectric layer deposited by sputtering at a room temperature to about 100° C. In yet another case, Japanese Published Application Nos. 2003-258260 and 2003-258261 disclose anodizing a gate electrode of Ta, Al, etc. to form a gate dielectric layer.

Unfortunately, although these conventional techniques provide their own ways of forming metal oxide as a gate dielectric layer of OTFT at a relatively low temperature, they fail to suggest a way of reducing the thickness of the gate dielectric layer. Gate dielectric thickness is approximately 0.5 µm in case of U.S. Pat. No. 6,207,472 and is between 61 nm and 450 nm in case of Korean Published Application No. 2005-31858. In case of Japanese Published Application Nos. 2003-258260 and 2003-258261, the thickness is described as 85.64 nm, for example.

On the other hand, researches to realize a thinner gate dielectric layer have been continuously carried out in the art. For example, a paper, "Low-voltage organic transistors with an amorphous molecular gate dielectric, Marcus Halik et al., Nature, vol. 431, 2004, pp. 963-966" teaches a 2.5 nm-thick molecular self-assembled monolayer (SAM) gate dielectric on a heavily doped silicon substrate. However, this may lack commercialization since there is no plan to electrically isolate discrete devices under the circumstances the heavily doped silicon substrate is used for gate electrodes.

Another paper, "One volt organic transistor, L. A. Majewski et al., Adv. Mater. 2005, 17, No. 2, pp. 192-196" proposes anodization of metal to form a metal oxide with a thickness of several nanometers as a gate dielectric layer. This may also lack commercialization since anodization, a kind of wet process, may invite an unfavorable peeling of metal.

SUMMARY OF THE INVENTION

Exemplary, non-limiting embodiments of the present invention provide an organic thin film transistor (OTFT) being operatable at a low-voltage. The OTFT has a gate dielectric layer of ultra-thin metal oxide self-grown by direct oxidation of a metal gate electrode in $O_2$ plasma process or alternatively has a dual gate dielectric layer composed of the metal oxide layer and an organic dielectric layer.

According to one exemplary embodiment of the present invention, a method of fabricating an OTFT comprises forming a gate electrode by depositing metal on a substrate; forming a gate dielectric layer on surfaces of the gate electrode by self-growing a metal oxide layer to a thickness lower than 10 nm through direct oxidation of the gate electrode in $O_2$ plasma process at a low temperature lower than 100° C.; depositing an organic semiconductor layer on the gate dielectric layer; and forming source/drain electrodes on the organic semiconductor layer such that the source/drain electrodes are spaced apart from each other.

In this method, forming of the gate electrode and the gate dielectric layer may be in-situ performed. When the gate electrode is deposited, a shadow mask with pattern may be used. When the gate dielectric layer is formed, an organic dielectric layer may be formed on the metal oxide layer. The organic dielectric layer may be a self-assembled organic molecular monolayer or a spin-coated organic layer. The substrate may be made of plastic or glass.

According to another exemplary embodiment of the invention, a fabricating method of an OTFT comprises forming a gate electrode by depositing metal on a substrate; forming a dual gate dielectric layer on surfaces of the gate electrode, the forming of the dual gate dielectric layer including self-growing a metal oxide layer to a thickness lower than 10 nm through direct oxidation of the gate electrode in $O_2$ plasma process at a low temperature lower than 100° C. and forming an organic dielectric layer on the metal oxide layer; forming source/drain electrodes on the dual gate dielectric layer such that the source/drain electrodes are spaced apart from each other; and depositing an organic semiconductor layer to cover the source/drain electrodes.

In this method, the gate electrode and the gate dielectric layer may be in-situ formed. When the gate electrode is deposited, a shadow mask with pattern may be used. The organic dielectric layer may be a self-assembled organic molecular monolayer or a spin-coated organic layer. The substrate may be made of plastic or glass.

According to still another exemplary embodiment of the invention, an OTFT comprises a substrate; a gate electrode formed of a patterned metal on the substrate; a gate dielectric layer self-grown on the gate electrode in $O_2$ plasma process at a low temperature lower than 100° C., the gate dielectric layer having a thickness lower than 10 nm; an organic semiconductor layer formed on the gate dielectric layer; and source/drain electrodes formed on the organic semiconductor layer, the source/drain electrodes being spaced apart from each other.

According to yet another exemplary embodiment of the invention, an OTFT comprises a substrate; a gate electrode formed of a patterned metal on the substrate; a dual gate dielectric layer including a metal oxide layer and an organic dielectric layer, the metal oxide layer being self-grown on the gate electrode in $O_2$ plasma process at a low temperature lower than 100° C. and having a thickness lower than 10 nm, and the organic dielectric layer being formed on the metal oxide layer; an organic semiconductor layer formed on the dual gate dielectric layer; and source/drain electrodes formed on the organic semiconductor layer, the source/drain electrodes being spaced apart from each other.

According to yet another exemplary embodiment of the invention, an OTFT comprises a substrate; a gate electrode formed of a patterned metal on the substrate; a dual gate dielectric layer including a metal oxide layer and an organic dielectric layer, the metal oxide layer being self-grown on the gate electrode in $O_2$ plasma process at a low temperature lower than 100° C. and having a thickness lower than 10 nm, and the organic dielectric layer being formed on the metal oxide layer; source/drain electrodes formed on the dual gate dielectric layer, the source/drain electrodes being spaced apart from each other; and an organic semiconductor layer formed on the source/drain electrodes.

DETAILED DESCRIPTION OF EXEMPLARY EMBODIMENTS

Exemplary, non-limiting embodiments of the present invention will now be described more fully hereinafter with reference to the accompanying drawings. This invention may, however, be embodied in many different forms and should not be construed as limited to the exemplary embodiments set forth herein. Rather, the disclosed embodiments are provided so that this disclosure will be thorough and complete, and will fully convey the scope of the invention to those skilled in the art. The principles and features of this invention may be employed in varied and numerous embodiments without departing from the scope of the invention.

It is noted that well-known structures and processes are not described or illustrated in detail to avoid obscuring the essence of the present invention. It is also noted that the figures are not drawn to scale. Rather, for simplicity and clarity of illustration, the dimensions of some of the elements are exaggerated relative to other elements. Like reference numerals are used for like and corresponding parts of the various drawings.

Device Structure of Organic Thin Film Transistor (OTFT)

Figure 1:
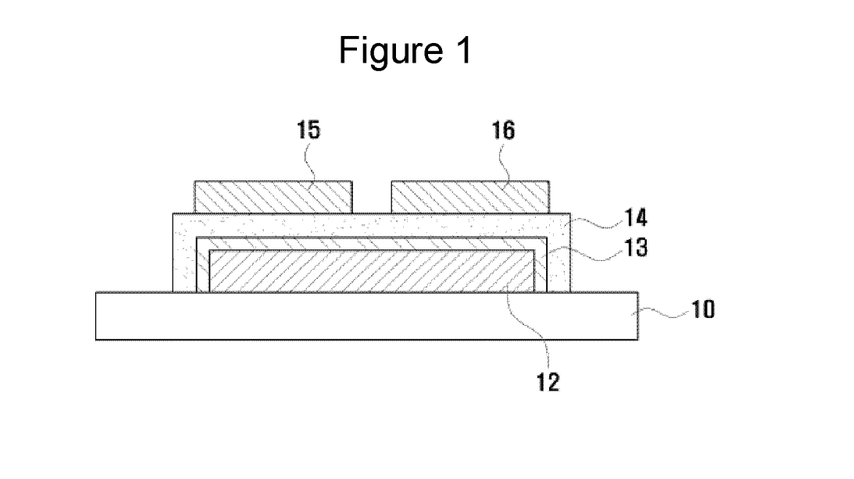
FIG. 1 is a cross-sectional view showing a low-voltage organic thin film transistor in accordance with an exemplary embodiment of the present invention.

FIG. 1 shows in a cross-sectional view a low-voltage organic thin film transistor in accordance with an exemplary embodiment of the present invention.

Referring to FIG. 1, a gate electrode 12 is formed on a substrate 10 made of, for example, plastic or glass. A thin gate dielectric layer 13 is formed on surface of the gate electrode 12. The gate electrode 12 is made of metal, which can be oxidized inherently, such as aluminum (Al), titanium (Ti), tantalum (Ta), etc. The gate dielectric layer 13 is self-grown by directly oxidizing the metal gate electrode 12. So the gate dielectric layer 13 is metal oxide such as aluminum oxide ($Al_2O_3$), titanium oxide ($TiO_2$), tantalum oxide ($Ta_2O_5$), etc. Particularly, the gate dielectric layer 13 of metal oxide is created in low-temperature process and has a thickness of about ten nanometers and below.

An organic semiconductor layer 14, such as pentacene layer, is formed on the gate dielectric layer 13. A source electrode 15 and a drain electrode 16 are formed on the organic semiconductor layer 14, being spaced apart from each other. The source and drain electrodes 15 and 16 are made of metal such as gold (Au) or aluminum (Al).

Fabrication Method of OTFT

A method of fabricating the aforementioned OTFT device will be described hereinafter. From the following descriptions of the fabrication, the structure of the OTFT will also become clearer. FIGS. 2A to 2D are cross-sectional views showing a fabrication method of the OTFT shown in FIG. 1.

Figure 2A:
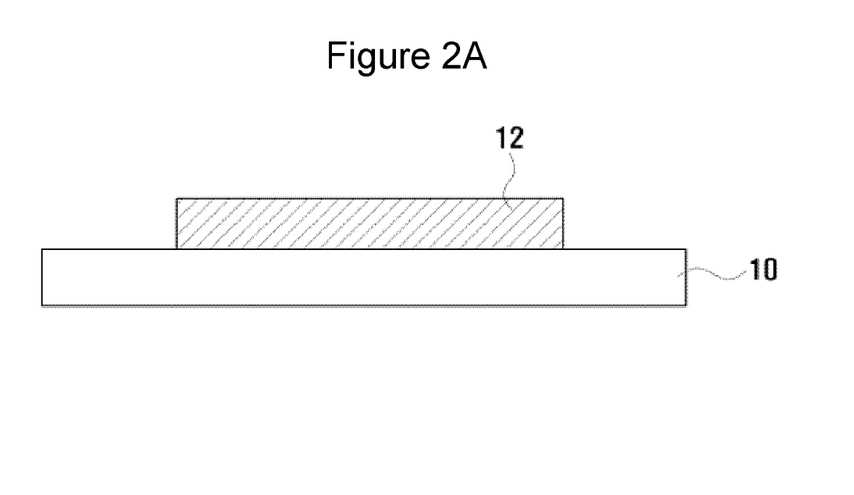
FIGS. 2A to 2D are cross-sectional views showing a fabrication method of the organic thin film transistor shown in FIG. 1.

Referring to FIG. 2A, the gate electrode 12 is formed on the substrate 10 made of plastic or glass. For example, to form the patterned gate electrode 12, metal is deposited by thermal evaporation using a shadow mask with pattern as well known in the art. In alternative cases, patterning of the gate electrode 12 may use photolithography, and deposition may use e-beam evaporation, sputtering, or other suitable technique. The gate electrode 12 may be made of aluminum, for example. However, the materials of the gate electrode 12 are not limited to specific kinds of metal. Deposition thickness of the gate electrode 12 may be 35~45 μm.

Figure 2B:
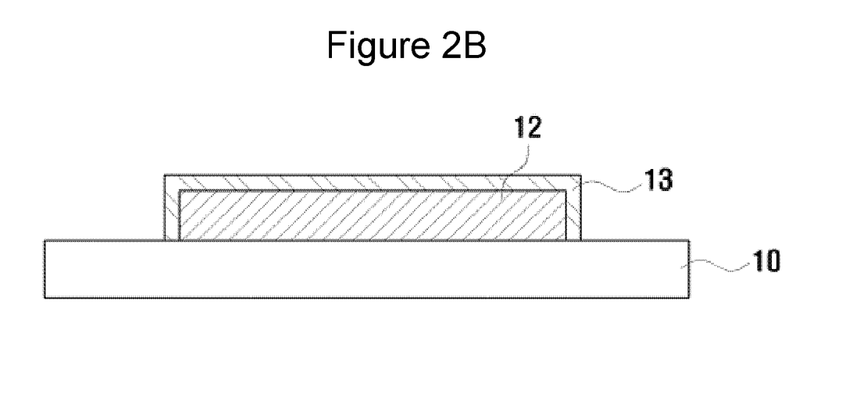

Next, as shown in FIG. 2B, the gate dielectric layer 13 is formed on the gate electrode 12 by direct oxidation using $O_2$ plasma process. Such direct oxidation of the gate electrode 12 enables metal oxide to be self-grown as the gate dielectric layer 13 to a thickness of 10 nm and below (e.g., 5 nm) at a low temperature (e.g., room temperature below than about 100° C.). For example, $O_2$ plasma process may be implemented for about 60 minutes under an $O_2$ flow ratio of about 10 sccm, a pressure of about 145 mtorr, and a power of about 150 W.

Figure 3:
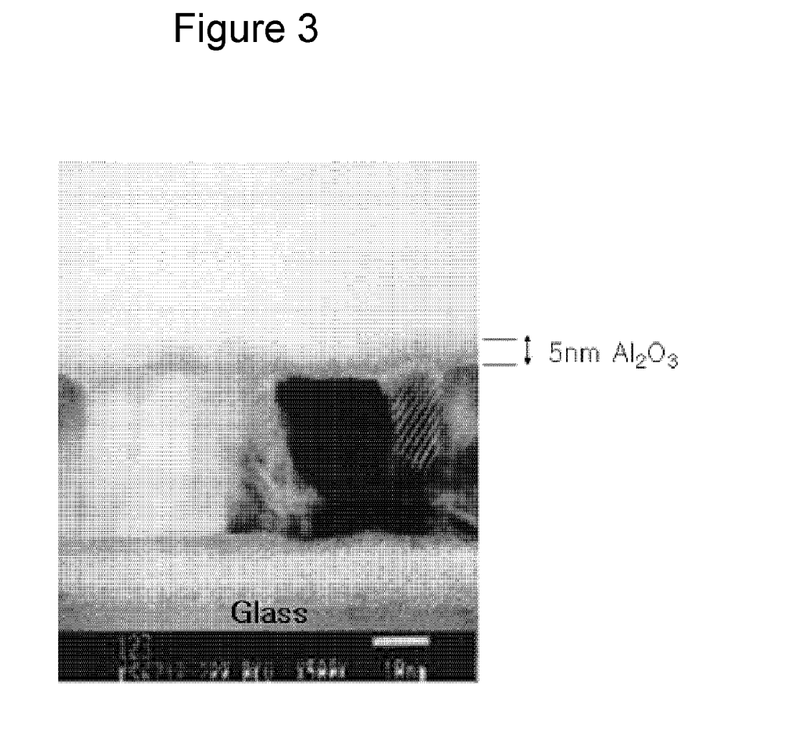
FIG. 3 is a TEM photograph showing an aluminum oxide layer of an experimental example of the present invention.

FIG. 3 shows, in a TEM photograph, an aluminum oxide layer formed as the gate dielectric layer through $O_2$ plasma process performed under the above conditions. In FIG. 3, the aluminum oxide layer on the gate electrode measured about 5 nm thick. It will be appreciated that the above conditions in $O_2$ plasma process are exemplary only and not to be considered as a limitation of exemplary embodiments of the present invention.

The following several advantages are related to self-growing formation of the gate dielectric layer 13 by using $O_2$ plasma process for directly oxidizing the gate electrode 12 at a low temperature in the present invention.

First, since direct oxidation is made at a low temperature lower than about 100° C., plastic or glass that is not suitable for high-temperature process can be favorably employed for the substrate 10.

Second, since the gate dielectric layer 13 is self-grown by directly oxidizing the gate electrode 12, the gate dielectric layer 13 can have an ultra thin thickness lower than 10 nm. It is therefore possible to realize an organic TFT that operates at a voltage lower than 2V. Additionally, this self-grown gate dielectric layer 13 does not require additional patterning process for discrete devices.

Third, in case the shadow mask is used for patterning the gate electrode 12, $O_2$ plasma process for the gate dielectric layer 13 can be in-situ performed in the same equipment as previous gate patterning process. Such in-situ process can eliminate unnecessary process time and reduce a possibility of pollution due to transference between equipments.

Figure 2C:
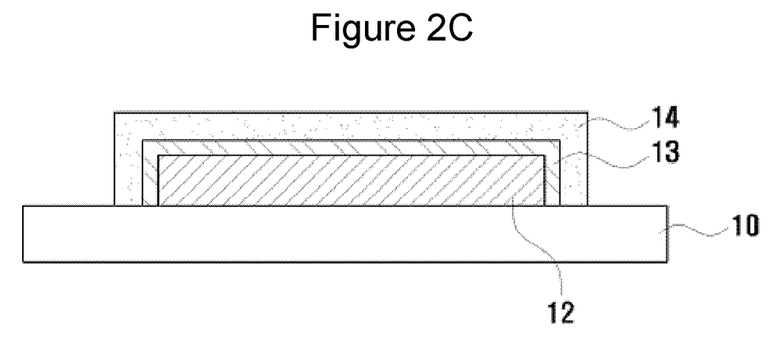

After the gate dielectric layer 13 is formed, as shown in FIG. 2C, the organic semiconductor layer 14 is deposited on the gate dielectric layer 13. For example, a pentacene layer is deposited by thermal evaporation with a growth rate of 1.8 nm/min up to 45 nm thickness at a substrate temperature of 80° C. It will be appreciated that the above material and deposition conditions of the organic semiconductor layer 14 are exemplary only and not to be considered as a limitation of exemplary embodiments of the present invention.

Figure 2D:
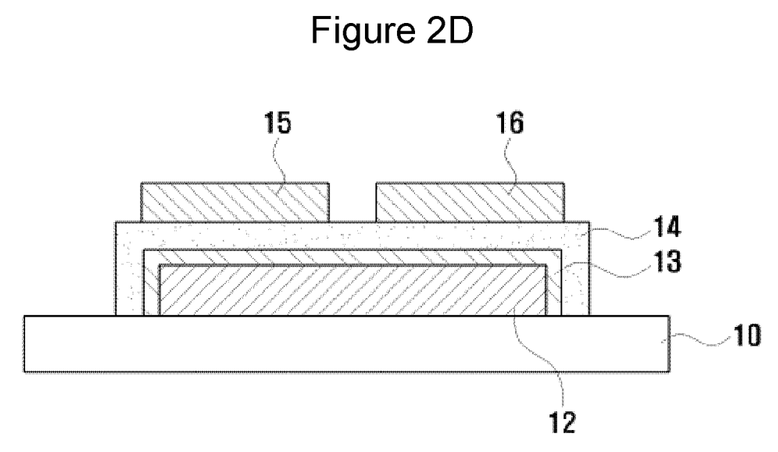

Finally, as shown in FIG. 2D, the source electrode 15 and the drain electrode 16 are formed on the organic semiconductor layer 14, being spaced apart from each other. For example, gold or aluminum is evaporated on the organic semiconductor layer 14 through a metal shadow mask.

OTFT Having a Dual Gate Dielectric Layer and Fabrication Thereof

Figure 4:
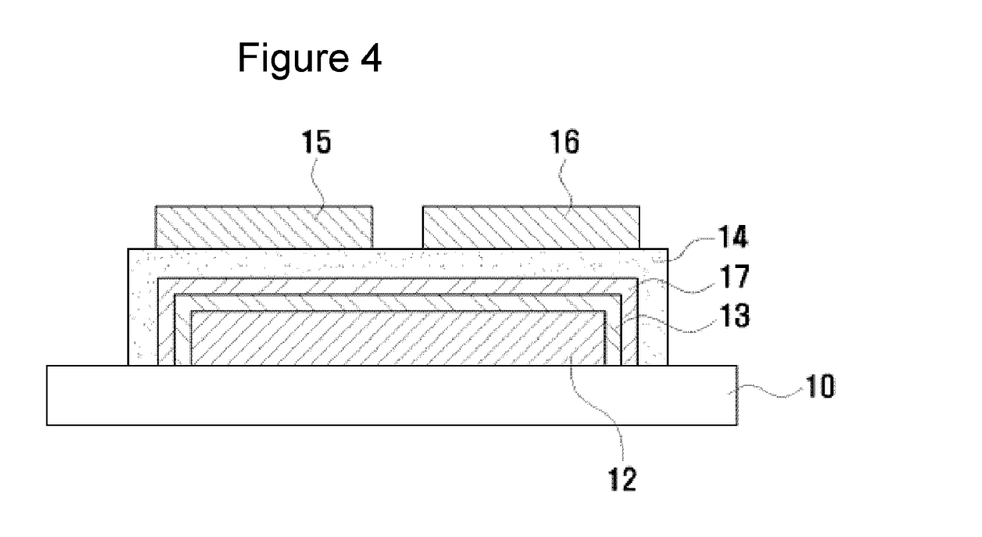
FIG. 4 is a cross-sectional view showing an organic thin film transistor having a dual gate dielectric layer in accordance with another exemplary embodiment of the present invention.

The above-discussed OTET has a single gate dielectric layer, however the OTFT of the present invention may alternatively have a dual gate dielectric layer. FIG. 4 shows such an OTFT having a structure of a dual gate dielectric layer.

Referring to FIG. 4, an organic dielectric layer 17 is additionally formed as the gate dielectric layer on the above-discussed metal oxide layer 13. This structure of a dual gate dielectric layer may further reduce the leakage current and improve the on/off current ratio.

The organic dielectric layer 17 may be a self-assembled organic molecular monolayer or a spin-coated organic layer. Octadecyltrichlorosilane (OTS), (benzyloxy)alkyltrimethoxysilane, and other suitable materials can be used for the self-assembled organic molecular monolayer. On the other hand, polystyrene and equivalents can be used for the spin-coated organic layer.

Figure 5:
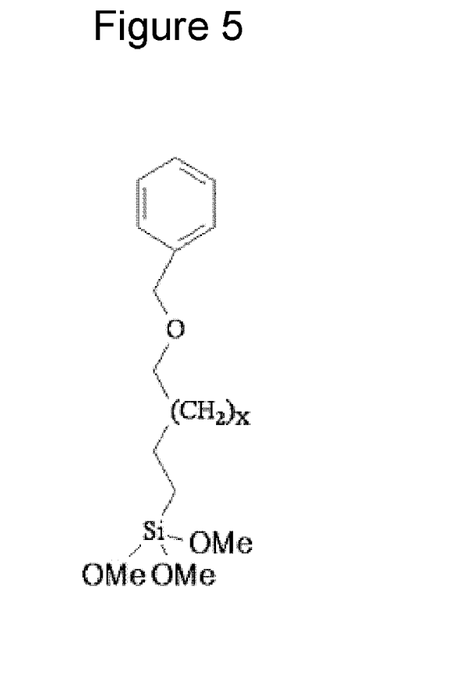
FIG. 5 is a view showing an example of a chemical structure of an organic molecular monolayer shown in FIG. 4.

FIG. 5 shows a chemical structure of an organic molecular monolayer formed of (benzyloxy)alkyltrimethoxysilane. As shown in FIG. 5, the chemical structure of the organic molecular monolayer is composed of a head part, an intermediate part, and a tail part. The head part has a low surface energy with the organic semiconductor layer. The intermediate part has an alkyl chain organization that exhibits high dielectric properties. The tail part has silane structure that may allow molecular self-assembled monolayers (SAM).

Returning to FIG. 4, the organic dielectric layer 17 may change surfaces of the metal oxide layer 13 from hydrophilicity to hydrophoicity, and thus may facilitate relatively dense formation of the organic semiconductor layer 14. This may enhance electrical characteristics of the OTFT, such as mobility, off state current, etc.

The self-assembled organic molecular monolayer may be formed as follows. In a glove box under a nitrogen atmosphere, the substrate 10 on which the metal oxide layer 13 is formed is dipped into a 0.1 mM OTS solution diluted with cyclohexane for about one hour. Thus the OTS molecular monolayer is self-assembled on the surface of the metal oxide layer 13.

Alternatively, the spin-coated organic layer may be formed as follows. A polystyrene material is spin-coated on the metal oxide layer 13 at 3000 rpm for about thirty seconds. Then a 10 nm-thick polystyrene layer is formed and dried in an oven at a temperature of about 100° C. for twenty-four hours.

OTFT having a Bottom Contact Structure and Fabrication Thereof

Figure 6:
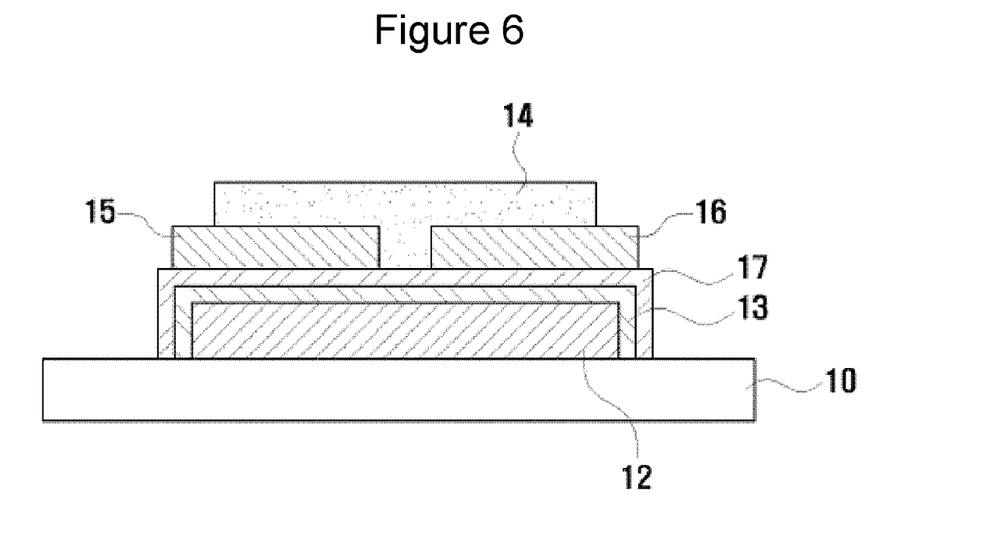
FIG. 6 is a cross-sectional view showing an organic thin film transistor having a bottom contact structure in accordance with yet another exemplary embodiment of the present invention.

The above-discussed OTETs have what is called a top contact structure that the source and drain electrodes are disposed over the organic semiconductor layer. Considering a reduction in size of the device in horizontal direction, more favorable than the top contact structure is a bottom contact structure that the source and drain electrodes are disposed under the organic semiconductor layer. It is however difficult to apply the bottom contact structure to the OTFT having a single gate dielectric layer as shown in FIG. 1. The reason is that the source and drain electrodes formed just above the metal oxide layer causes an increase in the leakage current. The dual gate dielectric layer as shown in FIG. 4 may be more favorable to the bottom contact structure since the organic dielectric layer is further formed on the metal oxide layer. FIG. 6 shows an OTFT having such a bottom contact structure.

Referring to FIG. 6, the source and drain electrodes 15 and 16 are disposed just on the organic dielectric layer 17 and then covered with the organic semiconductor layer 14. This bottom contact structure may be realized by altering the order of fabricating process.

We did some electrical experiments to examine the performance of the OTFT according to the present invention. Hereunder we summarize results of experiments.

EXPERIMENTAL EXAMPLE 1

Electrical Characteristics of Aluminum Oxide

Figure 7:
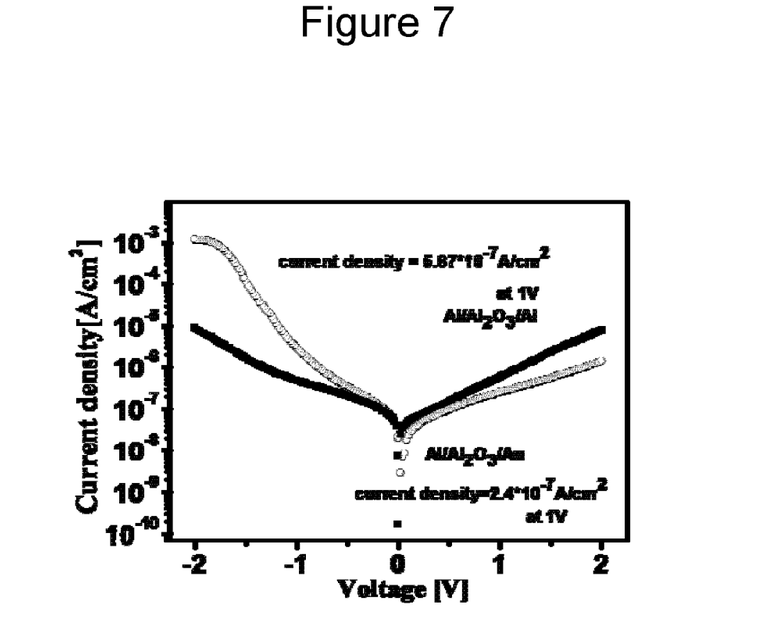
FIG. 7 is a graph showing the I-V characteristic curve of the aluminum oxide layer shown in FIG. 3.
Figure 8:
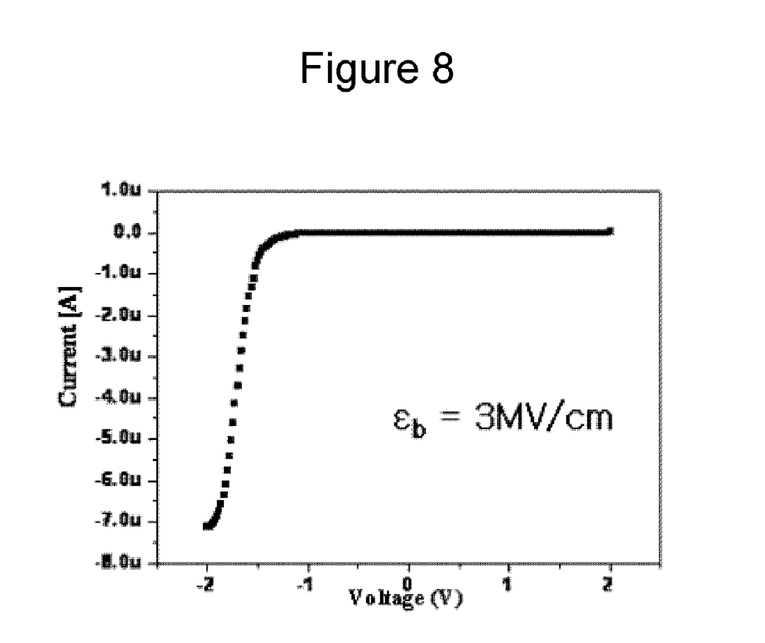
FIG. 8 is a graph showing the breakdown voltage curve of the aluminum oxide layer shown in FIG. 3.
Figure 9:
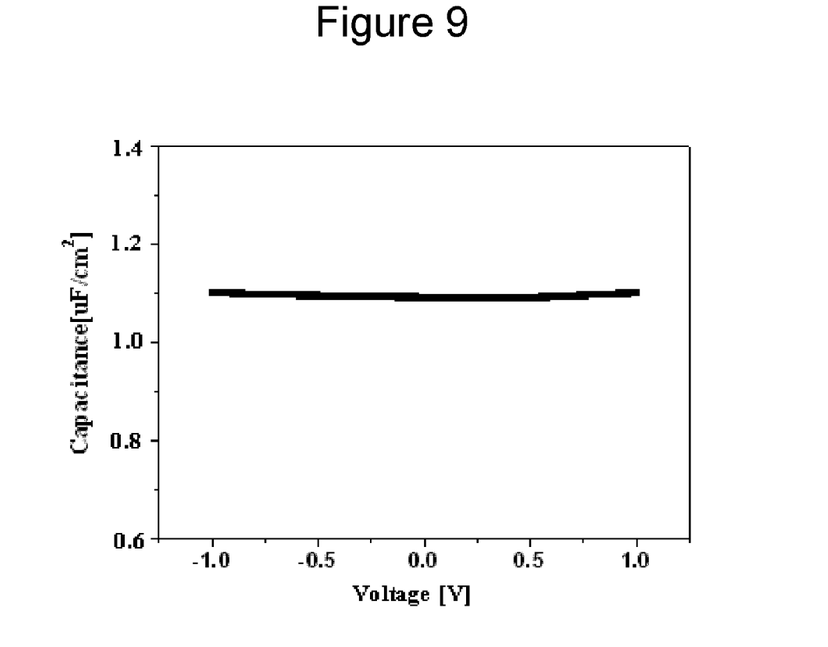
FIG. 9 is a graph showing the capacitance curve of the aluminum oxide layer shown in FIG. 3.

To investigate electrical characteristics of the aluminum oxide layer shown in FIG. 3, I-V (current-voltage) and C-V (capacitance-voltage) measuring experiments were carried out. For these experiments, we used well-known suitable equipments, HP4155A and HP4280A, respectively. FIGS. 7 to 9, obtained from such experiments, show the I-V characteristic curve, the breakdown voltage curve, and the capacitance curve of the aluminum oxide layer, respectively.

FIG. 7 plots the I-V curves in Al/Al$_2$O$_3$/Al structure and in Al/Al$_2$O$_3$/Au structure. The result of FIG. 7 shows different leakage current densities in both structures. For example, the Al/Al$_2$O$_3$/Al structure exhibits relatively high current density of 5.87×10$^{-7}$ A/cm$^2$ at 1V, whereas the Al/Al$_2$O$_3$/Au structure does relatively low current density of 2.4×10$^{-7}$ A/cm$^2$ at 1 V. This may be caused by a difference in work function between aluminum and gold.

As depicted in FIG. 8, the breakdown voltage of the aluminum oxide layer is roughly 3 MV/cm in the Al/Al$_2$O$_3$/Au structure.

FIG. 9 shows the C-V curve in the Al/Al$_2$O$_3$/Al structure, in which the capacitance of the aluminum oxide layer is about 1.1 μF/cm$^2$. Considering the thickness of the aluminum oxide layer shown in FIG. 3, the dielectric constant is calculated to about 6.2.

EXPERIMENTAL EXAMPLE 2

Electrical Characteristics of Pentacene OTFT

Figure 10A:
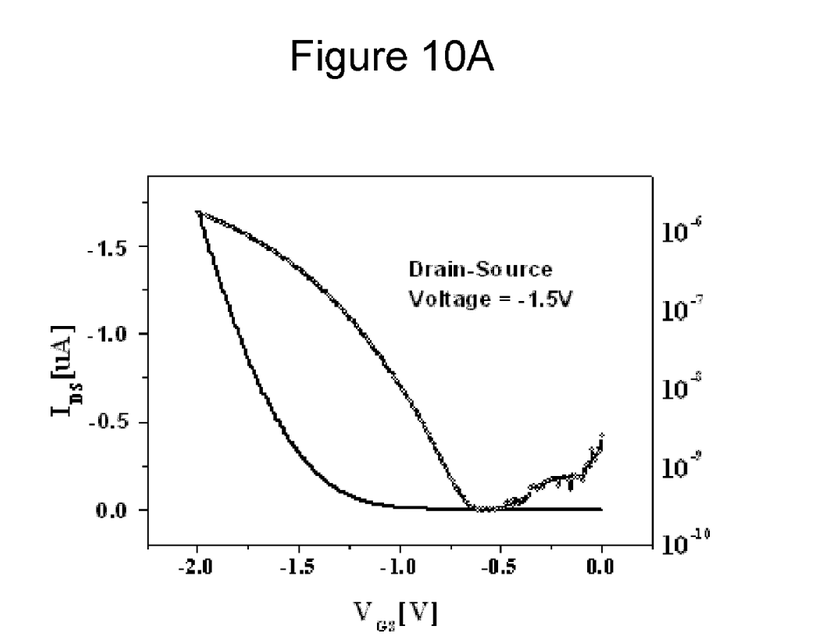
FIGS. 10A and 10B are graphs respectively showing $I_{DS}$-$V_{GS}$, $I_{DS}$-$V_{DS}$ characteristics curves of the OTFT having the aluminum oxide layer shown in FIG. 3.
Figure 10B:
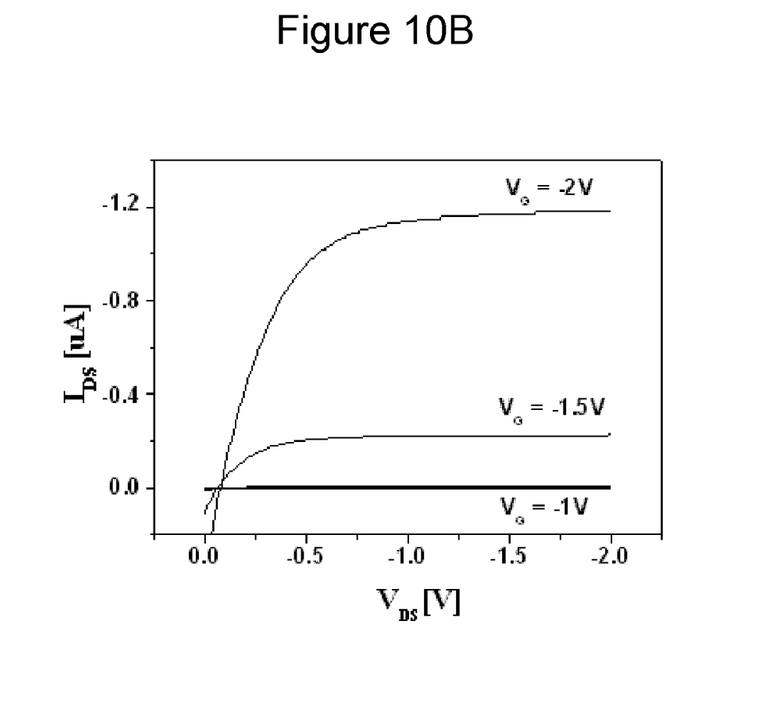

FIGS. 10A and 10B respectively show $I_{DS}$-$V_{GS}$, $I_{DS}$-$V_{DS}$ characteristic curves of the pentacene OTFT having the aluminum oxide layer shown in FIG. 3. Electrical characteristics thereof are shown in the following Table 1.

TABLE 1

| Mobility (cm$^2$/V·sec) | On/Off Current Ratio($I_{on}/I_{off}$) | Threshold Voltage (V) | Subthreshold Slope (V/dec) | Off State Current (pA/μm) |
|---|---|---|---|---|
| 0.1 | 6.3 × 10$^3$ | −1.13 | 0.206 | 0.25 |

As shown in Table 1, the OTFT has a mobility of 0.1 cm$^2$/V·sec, an on/off current ratio ($I_{on}/I_{off}$) of 6.3×10$^3$, a threshold voltage ($V_t$) of −1.13V, a subthreshold slope of 0.206V/dec, and an off state current of 0.25 pA/μm. Moreover, at $V_{GS}$=−2V, a drain/source saturation voltage ($V_{DS,sat}$) was measured to −0.7V, thus confirming a low-voltage operation of the OTFT.

EXPERIMENTAL EXAMPLE 3

Electrical Characteristics of Dual Gate Dielectric Layer

To investigate electrical characteristics of the dual gate dielectric layer shown in FIG. 4, I-V and C-V measuring experiments were carried out like the previous experimental example 1.

Figure 11:
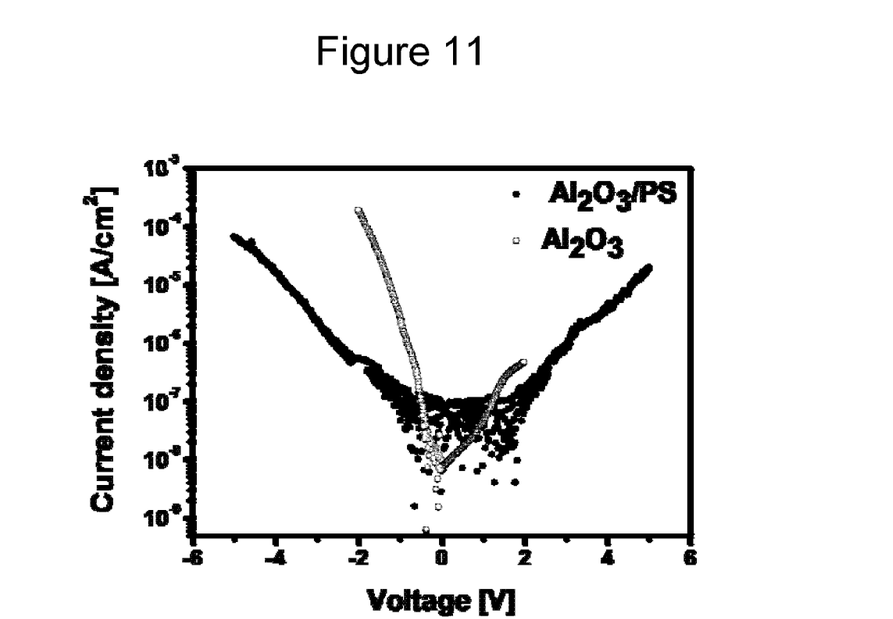
FIG. 11 is a graph showing the I-V characteristic curve of the dual gate dielectric layer shown in FIG. 4.

As shown in FIG. 11 plotting the I-V curve in Al/Al$_2$O$_3$-polystyrene/Au structure, the leakage current density is approximately 10$^{-6}$ A/cm$^2$ at −2V. Furthermore, though not depicted, the capacitance of the dual gate dielectric layer is about 1.77×10$^{-7}$ F/cm$^2$ in the Al/Al$_2$O$_3$-polystyrene/Au structure.

EXPERIMENTAL EXAMPLE 4

Electrical Characteristics of Pentacene OTFT

Figure 12A:
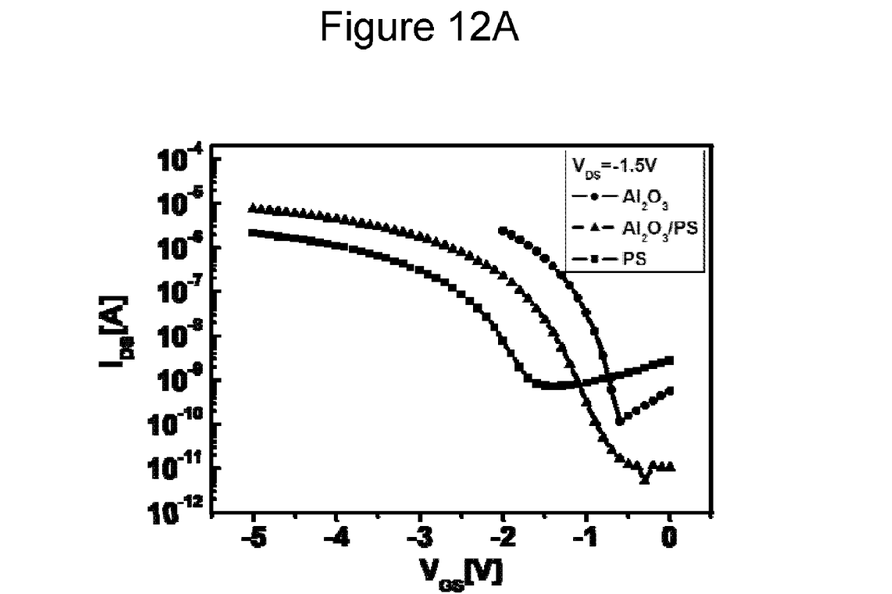
FIGS. 12A and 12B are graphs respectively showing $I_{DS}$-$V_{GS}$, $I_{DS}$-$V_{DS}$ characteristics curves of the OTFT having the dual gate dielectric layer shown in FIG. 4.
Figure 12B:
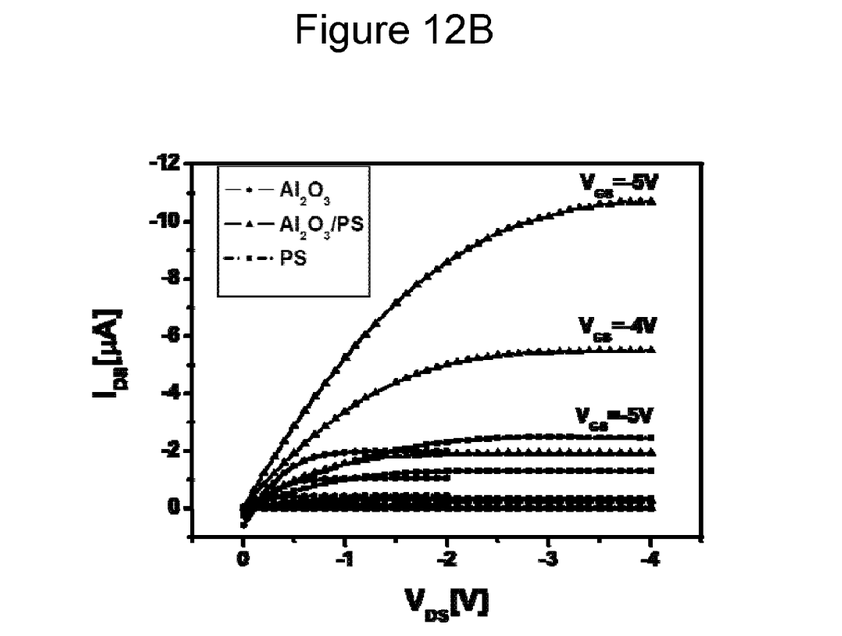

FIGS. 12A and 12B respectively show $I_{DS}$-$V_{GS}$, $I_{DS}$-$V_{DS}$ characteristic curves of the pentacene OTFT having the dual gate dielectric layer shown in FIG. 4. Electrical characteristics thereof are shown in the following Table 2.

TABLE 2

| Mobility (cm$^2$/V·sec) | On/Off Current Ratio($I_{on}/I_{off}$) | Threshold Voltage (V) | Subthreshold Slope (V/dec) | Off State Current (A) |
|---|---|---|---|---|
| 0.71 | 5.95 × 10$^5$ | −1.42 | 0.3 | 1.13 × 10$^{-11}$ |

As fully discussed hereinbefore, the low-voltage operatable OTFT of the present invention has many advantages in comparison with conventional OTFTs, as follows.

First, the OTFT of the invention is fabricated by low-temperature process ranging from a room temperature to about 100° C. So the OTFT of the invention can employ a plastic or glass substrate not suitable for typical high-temperature process.

Second, the OTFT of the invention has ultra-thin metal oxide as the gate dielectric layer, so operating voltage thereof can be significantly reduced. Further, the OTFT can be available for flexible displays, RFID, etc.

Third, the OTFT of the invention requires no process of patterning the gate dielectric layer for discrete device separation. So related fabrication processes are made simpler.

Fourth, the OTFT of the invention allows in-situ process of forming both the gate electrode and the gate dielectric layer, so no transference between equipments can eliminate unnecessary process time and reduce a possibility of pollution.

Fifth, the OTFT of the invention can have the dual gate dielectric layer further enhancing electrical characteristics such as leakage current, on/off current ratio, mobility, off state current, etc.

Sixth, the OTFT of the invention can have the bottom contact structure favorable for a reduction in size of the device in horizontal direction.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of fabricating an organic thin film transistor, the method comprising:
   forming a gate electrode by depositing metal on a substrate;
   forming a gate dielectric layer on surfaces of the gate electrode by self-growing a metal oxide layer to a thickness lower than 10 nm through direct oxidation of the gate electrode in O$_2$ plasma process at a low temperature lower than 100° C.;
   depositing an organic semiconductor layer on the gate dielectric layer; and
   forming source/drain electrodes on the organic semiconductor layer such that the source/drain electrodes are spaced apart from each other.

2. The method of claim 1, wherein the forming of the gate electrode and the forming of the gate dielectric layer are in-situ performed.

3. The method of claim 2, wherein the depositing of the metal for the gate electrode is performed using a shadow mask with pattern.

4. The method of claim 1, wherein the substrate is made of plastic or glass.

* * * * *